United States Patent [19]

Schertler et al.

[11] Patent Number: 5,490,913

[45] Date of Patent: Feb. 13, 1996

[54] MAGNETIC FIELD ENHANCED SPUTTERING ARRANGEMENT WITH VACUUM TREATMENT APPARATUS

[75] Inventors: Roman Schertler, Wolfurt, Austria; Walter Haag, Grabs; Peter Kohler, Malans, both of Switzerland

[73] Assignee: Balzers Aktiengesellschaft, Balzers, Liechtenstein

[21] Appl. No.: 236,535

[22] Filed: May 2, 1994

[30] Foreign Application Priority Data

May 4, 1993 [CH] Switzerland .............. 1362/93

[51] Int. Cl.⁶ .................................. C23C 14/35
[52] U.S. Cl. .................. 204/298.2; 204/298.09
[58] Field of Search ............. 204/298.09, 298.2, 204/298.22

[56] References Cited

U.S. PATENT DOCUMENTS 5,252,194  10/1993  Demaray et al. ............ 204/298.2

FOREIGN PATENT DOCUMENTS

| 0365249A2 | 4/1990 | European Pat. Off. . | |
| 0439360A2 | 7/1991 | European Pat. Off. ............ | 204/298.2 |
| 0439361A2 | 7/1991 | European Pat. Off. ............ | 204/298.2 |
| 3331245 | 8/1993 | Germany ........................... | 204/298.2 |
| WO92/02660 | 2/1992 | WIPO ............................... | 204/298.22 |

*Primary Examiner*—Aaron Weisstuch
*Attorney, Agent, or Firm*—Notaro & Michalos

[57] ABSTRACT

A magnetic field enhanced sputtering arrangement and vacuum treatment apparatus includes an arrangement housing, on whose front face is mountable a target arrangement. A magnet carrier arrangement is rotatably supported about an axis in the arrangement housing. Magnetic flux of the magnet carrier penetrates through a region of the mounted target arrangement and the region is shifted through a relative rotational motion. An electric motor drive with a drive housing is connected to the arrangement housing so as to be torsion-tight therewith, and a rotor is rotatably supported in the drive housing, which, in turn, acts upon the magnet carrier arrangement. The drive housing forms the arrangement housing and the rotor is connected to the magnet carrier arrangement so as to be non-rotatable therewith, for a compact construction.

20 Claims, 2 Drawing Sheets

MAGNETIC FIELD ENHANCED SPUTTERING ARRANGEMENT WITH VACUUM TREATMENT APPARATUS

FIELD AND BACKGROUND OF THE INVENTION

The present invention relates to a magnetic field enhanced sputtering arrangement having a drive housing which forms the arrangement housing, and a rotor which is connected to a magnet carrier arrangement in a torsion-tight or non-rotatable manner. The present invention also relates to a vacuum treatment apparatus equipped with the magnetic field enhanced sputtering arrangement of the invention.

It is known to sputter materials, be they electrically conducting or electrically insulating, in vacuo, wherein an electric field is generated in a reaction chamber, between the surface of the material to be sputtered, i.e., the target surface and a counter electrode. A plasma discharge is formed, and with the positive ions of a gas introduced into the reaction chamber, the surface of the material to be sputtered is sputtered. The material thus sputtered is used either directly for coating workpieces in the chamber, or in the form of a reaction product after reacting with a reactive gas supplied to the chamber.

Such sputtering processes are carried out in DC plasmas, HF plasmas, or in plasmas which are generated by DC and superimposed AC.

In spite of entirely different details in the mechanism of a sputtering process proper, for the stated case of plasma excitation, it is further known to increase the plasma density and therewith the sputtering rate by generating a magnetic field in the region of the target surface to be sputtered. A sputtering process of this type, which is enhanced by a magnetic field, is known for example by the term magnetron sputtering.

It is further known to close at least partially, the flux of this magnetic field, by forming a tunnel thereof over the target surface.

Moreover, it is known, such as for example for magnetron sputtering, from EP-0 399 710, U.S. Pat. No. 5,130,005, DE-A-33 31 245 or as depicted in DE-A-35 06 227, to move the flux of the magnetic field with respect to the target surface, and in this way to reach the range of the maximum sputtering rate, be this in order to sputter the target as uniformly as possible, or in order to achieve, on the work piece, a desired distribution of the rate of deposition of the material.

It is also known in reactive sputtering to move the flux relative to the sputtered surface.

Additionally, the provided target arrangements can be planar in this arrangement, as is the case with the known planar magnetron arrangement, or they can define volume surfaces, such as for example concave surfaces, in which connection, reference is made to the pot-shaped magnetron arrangement according to DE 35 06 227. This target arrangement can be implemented integrally or it can comprise several targets.

In its broadest aspect, the present invention relates to all stated sputtering techniques and appropriate magnetic field enhanced sputtering arrangements.

Regarding a planar magnetron, it is known from DE-A-33 31 245 as well as from U.S. Pat. No. 5,130,005, with respect to the realization of a relative motion between a magnetic field flux and a target surface, to move a magnet arrangement under the target arrangement. According to DE-A-33 31 245, for this purpose a magnet arrangement is moved along the target arrangement in a cooling medium chamber, which is closed off on one side from the target arrangement by holding plates. This magnet arrangement is moved eccentrically with respect to an axis of rotation or it is additionally guided by cams. In this way a tunnel-shaped magnetic field is generated, moving along the target surface to be sputtered. The rotational drive of the magnet arrangement takes place either through the flow of the cooling medium, namely water, through the cooling chamber, or via a drive shaft extending through the chamber wall.

A magnetic field enhanced sputtering arrangement of the above mentioned type and implemented as a planar magnetron, is known from U.S. Pat. No. 5,130,005. It comprises a housing, on the front face of which a target arrangement can be mounted, which here comprises exclusively the target and the target plate below it. This target arrangement can only be mounted or dismounted by dismantling the arrangement. The housing defines an annular chamber adjoining the mounting plate. A magnet carrier is movably supported about a hinge pin in the housing. The magnet in a magnet arrangement including the carrier, generates a magnetic field whose flux penetrates through the region of the target. The magnetic field is shifted by the relative rotational movement between the magnet carrier arrangement and the target, which is stationary in the housing.

Furthermore, an electric motor is provided which acts upon the magnet carrier arrangement via toothed belts and gearing via a pinion axle which extends through the wall of the chamber. In this arrangement, it is a disadvantage that the electric motor and the drive transmission provided between the magnet carrier and the electric motor, take up a great deal of space. Additionally, the drive motor is mounted at an offset position from the annular chamber which function as a cooling chamber. The drive motor thus must be cooled separately. A further disadvantage is that by means of an expensive electronic monitoring system, the movement of the magnet arrangement itself must be monitored in order to detect defects between the drive motor and the magnet arrangement.

SUMMARY OF THE INVENTION

It is the task of the present invention to eliminate these disadvantages in a magnetic field enhanced sputtering arrangement of the above mentioned type.

This is achieved through the invention, which comprises a magnetic field enhanced sputtering arrangement with an arrangement housing, on whose front face is mountable a target arrangement. A magnet carrier arrangement rotatably supported about an axis, is provided in the arrangement housing. Flux ($\Phi_B$) of a magnet on the carrier penetrates through a region of the mounted target arrangement and is shifted through relative rotational motion. An electric motor drive with a drive housing connected to the arrangement housing so as to be torsion-tight, has a rotatably supported rotor which, in turn, acts upon the magnet carrier arrangement. According to the invention, the drive housing forms the arrangement housing and the rotor is connected to the magnet carrier arrangement so as to be torsion-tight or non-rotatable.

In this way, the drive housing simultaneously forms the housing for the rest of the arrangement and the rotor is connected in a non-rotatable manner, to the magnet carrier.

An extremely compact construction results. Since, further, the target arrangement must be cooled effectively and is mounted in the arrangement housing, which in turn, is the housing for the drive, the basis is created for simultaneously cooling the target arrangement and the electric motor drive, using the same cooling system. The construction according to the invention also avoids gearing and thus makes possible a drastic reduction of the number of moving parts. This increases operating safety, reduces production cost, and leads to an extremely compact construction.

The term electric motor drive herein means a drive in which electromagnetic fields establish an operational linkage between a stator and a rotor.

The compact construction of the sputtering arrangement is further increased, preferably in that the electric motor transmission ($\phi_M$) between the housing and rotor takes place via an annular air gap which is coaxial to the axle, and whose diameter is significantly greater than its axial extent. In a preferred embodiment that is implemented as a magnetron, preferably as a planar magnetron, wherein the magnetic field flux exits in tunnel-like fashion from the mounted target arrangement and enters it again.

According to another feature of the invention, the motion of the magnetic field flux along the target surface to be sputtered is laid out in the form of a preselected path, and preferably as a closed path. This is readily possible since magnets are disposed on the magnet carrier arrangement, which primarily carries out a rotational motion, and the magnets are controllably movable on the carrier and/or, if electromagnets are used, they are driven selectively in terms of time or angle of rotation and/or the magnets are disposed eccentrically.

Although it is entirely possible in a system which allows relative movement between the target and magnet carrier, and with respect to an apparatus on which the arrangement according to the invention is mounted, e.g. a system which is absolutely at rest, to move the target and leave the magnet carrier at absolute rest; in a highly preferred embodiment, the housing is implemented for mounting on a vacuum coating apparatus and therewith, to form the reference system which is at rest.

A vacuum treatment apparatus, according to the invention, is distinguished due to the stated advantages of the sputtering arrangement according to the invention, and those yet to be described, in particular by an extremely compact construction.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

DESCRIPTION OF THE PREFERRED EMBODIMENTS

Figure 1:
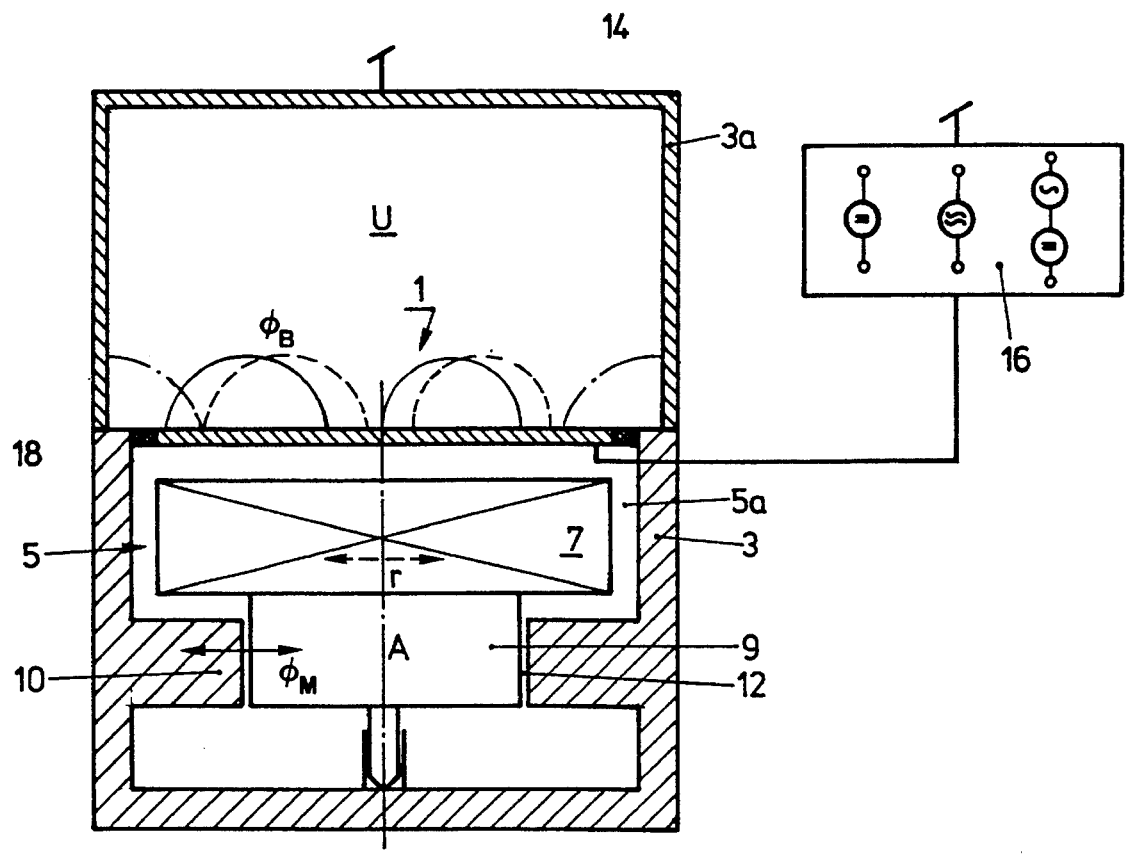
FIG. 1 schematically illustrates the basic principle of the sputtering arrangement according to the invention, with the housing at rest and using a planar target.

FIG. 1 schematically depicts a magnetic field enhanced sputtering arrangement according to the invention with planar target arrangement 1, which comprises, in particular, a target plate. The target arrangement 1 closes off housing 3 of the sputtering arrangement, against a process volume U and is connected to housing 3 at 18. Within the housing 3, and in a magnet carrier chamber 5a a magnet carrier arrangement 5 is rotatably supported about an axis A. The carrier arrangement includes permanent and/or electromagnets 7. The arrangement formed by magnets 7 can comprise permanent and/or electromagnets which are mounted to be stationary on the carrier 5 or, as shown schematically at r in dashed lines, the permanent and/or electromagnets, in addition to rotation about axis A, are movable with respect to the carrier 5, radially and/or azimuthally, generally in such a way that with respect to housing 3, the magnets travel on a given path. In this way, the region on the surface of the target arrangement 1 and to be sputtered, through which and along which the magnetic field flux $\Phi_B$ is effective, is shifted along appropriate paths, which can also take place by driving electromagnets that are fixedly provided on the magnet carrier 5.

In FIG. 1 the course of the flux $\Phi_B$, with magnets disposed eccentrically to axis A (solid line and dashed line) and, with a tunnel-shaped flux over the target surface are shown purely schematically and qualitatively. A dot-dash line illustrates the flux which can also be used, in particular, with HF applications.

The magnetic field flux $\Phi_B$ depicted schematically in FIG. 1, is at least partially closed in a tunnel-shaped manner over the target surface to be sputtered and/or is largely closed over structures in the proximity of the target, such as frames of the housing 3.

The magnet carrier arrangement 5, according to the invention, is coupled so as to be resistant to torsion (in a non-rotatable manner), to a rotor 9 of an electric motor drive, whose stator 10 is connected in a manner that is resistant to torsion, to the housing 3. A force-transmitting electromagnetic driving flux $\Phi_M$ acts across an annular air gap 12. The depicted sputtering arrangement is DC operated or high frequency operated or is operated in a mixed form, with DC and AC as a magnetron and consequently, a plasma discharge is generated via a counter electrode 14. As is customary, the process chamber 3a of the housing, together with counter electrode 14 can be connected to a reference potential, such as for example to ground potential. Further, as is known to the expert, the counter electrode 14 can be connected to a bias potential or a bias electrode can be provided separately.

In FIG. 1, the different options for electrically feeding the plasma discharge are depicted schematically on the power source unit 16.

Figure 2:
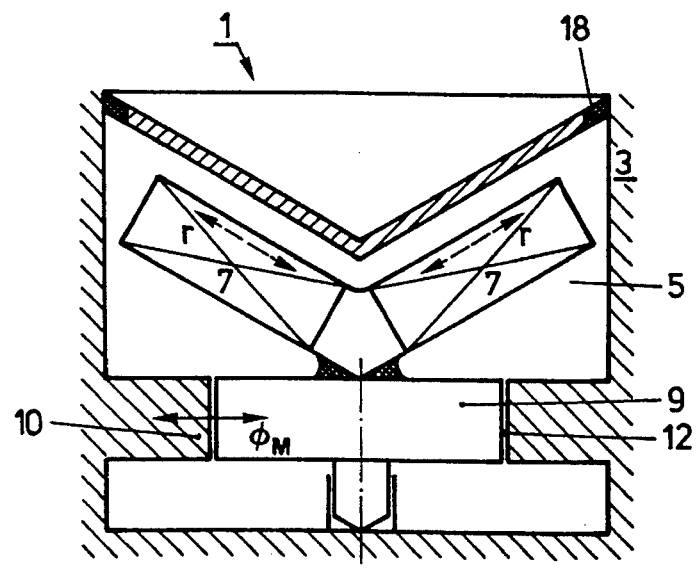
FIG. 2 is a view which is analogous to FIG. 1, and schematically illustrates the fundamental arrangement according to the invention, in the form of a pot-shaped magnetron.

FIG. 2 depicts the sputtering arrangement similar to FIG. 1, but for a non-planar target surface to be sputtered, namely, as an example, a cone-shaped target, wherein, as with the target arrangement according to FIG. 1 as, the surface to be sputtered can be formed by a single target or by several targets.

Figure 3:
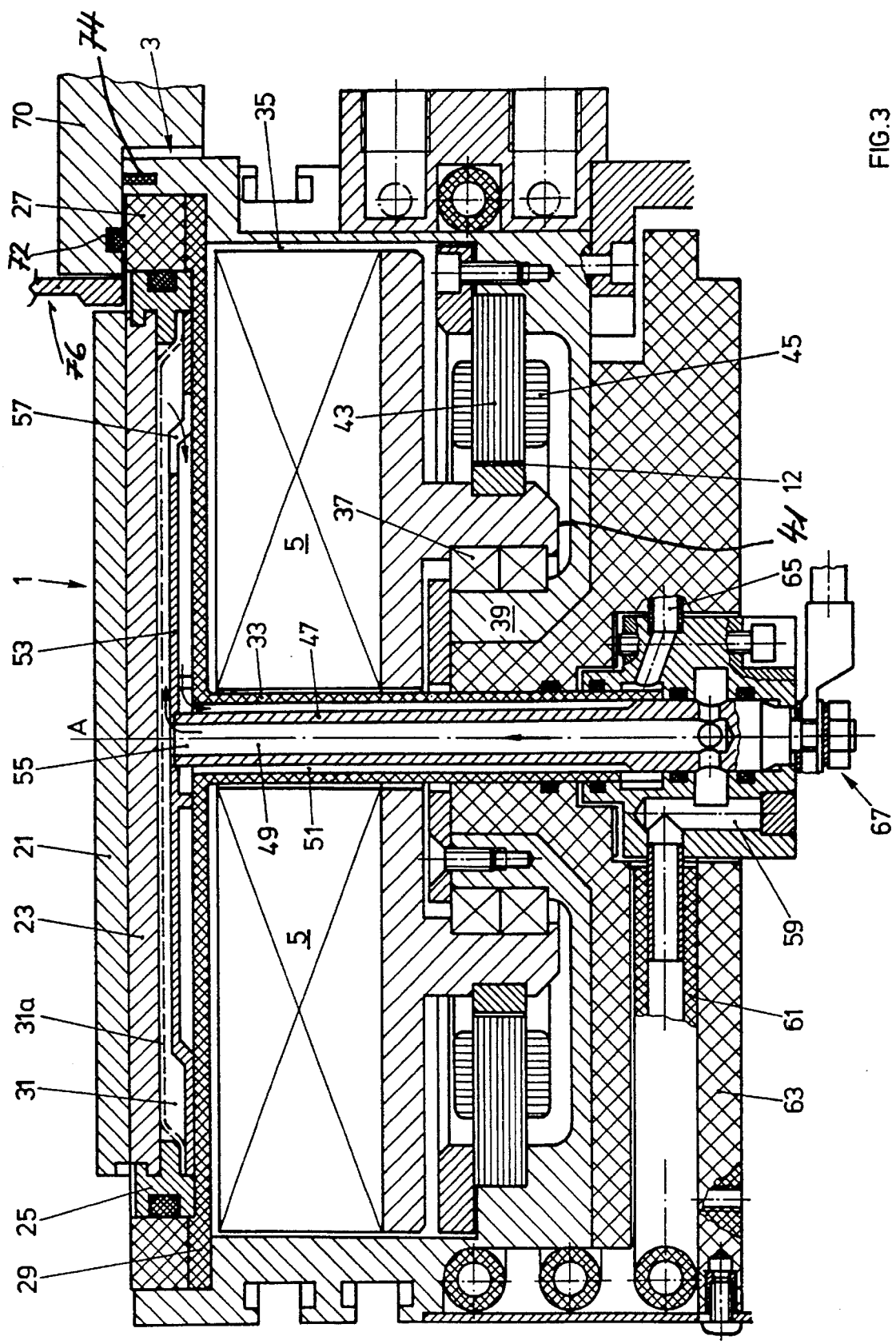
FIG. 3 is a longitudinal sectional view of an embodiment which is preferred today and which comprises the magnetic field enhanced sputtering arrangement according to the invention, in which all advantageous partial aspects of the invention are used in combination.

FIG. 3 depicts an embodiment of a sputtering source according to the invention which is preferred today, for example, in the form of a planar magnetron. The cathode arrangement 1 comprises the target plate 21 proper and here for example a rear backing plate 23, which plates, in the mounted state, are closely thermally coupled, as well as also electrically coupled, such as through mutual prestressing or bonding.

The target arrangement 1, acting electrically as a block, is detachably mounted on the housing 3 of the arrangement, namely on a metal mounting flange 25. The target arrangement 1 is clamped on the mounting flange 25 with a vise, or forms, as in the present case, with the flange 25, a target replacement quick lock, such as a bayonet catch. A lock of this type is known from EP-A-0 512 456 which, in this respect, is an integral component of the present specification.

The mounting flange 25 is connected via an insulating flange 27 to the remaining parts of the housing 3, the housing being essentially in the form of a bell. At the side of the target arrangement, a wall 29 comprising essentially a rigid plastic material, defines together with the target arrangement 1, a cooling chamber 31. One side of the cooling chamber 31 is defined directly by the target arrangement 1, or by a heat-conducting foil 31a, which through the pressure in the cooling medium, is pressed against the target arrangement 1.

If the target arrangement 1 is exchangeable by means of a quick lock, the medium-activated foil according to EP-A-512 456 serves as a tension or tension-relief element for the lock, such as, for example, for a bayonet catch.

Wall 29 continues coaxially toward axis A and then forms a pipe 33, which, together with wall 29 in housing 3, define an annular magnet carrier chamber 35. A rotor 41 is rotatably supported on bearing 37, at a central housing portion 39, centrally supporting the pipe 33 or, generally, the central axis. A torsion-resistant, that is, non-rotatable stator 43 on housing 3 together with rotor 41, defines the annular air gap 12, which forms the electric motor drive of the rotor 41. The magnet carrier arrangement 5 is supported on the rotor 41 so as to be non-rotatable therewith. The magnet carrier arrangement 5 revolves in the magnet carrier arrangement chamber 35, when the rotor is driven. The diameter of ring-shaped gap 12 is substantially greater than the axial extent of the gap so that a precise and, in particular, sufficiently slow rotational driving of the rotor can take place and simultaneously the volume defined by the target arrangement 1 is optimally utilized in the sense of the compact construction of the arrangement, and thus a gearing can be omitted.

An asynchronous motor with stator windings 45 and winding-free rotor is preferably used as the drive. The motor has an optimum flat construction when viewed axially.

Depending on the use, another drive motor can also be used, for example, an electronically commutated motor or a DC motor which is electronically driven.

The interior volume of pipe 33 comprising, as already stated, an electrically insulating material, preferably a synthetic material, is divided by means of an inner pipe 47 acting as a separating wall, into a feed line 49 and a return line 51 for circulating a cooling medium to and from the cooling chamber 31. The metal inner pipe 47 is connected electrically to a metal separating wall 53 which extends essentially parallel to wall 29 and to the target arrangement 1, through the cooling chamber 31. An outlet opening 55 is provided in a central region of the separating wall 53, through which the cooling medium flowing through the feed line 49 in the direction of the arrow, flows to the outside, along the target arrangement 1. Return flow openings 57 are provided on the periphery of the separating wall 53, by which the cooling medium flows radially back into the return line 51. If a foil 31a is provided and if it is electrically conducting, it ensures a contact region on the target arrangement, over a large area.

The feed line 49 in pipe 33 is connected via a connection line arrangement 59, to a flexible plastic tube 61, which, embedded in a plastic portion 63 of housing 3, extends to the outside and there, loops several times around the outer surface of the housing 3. The return line 51 communicates with a line arrangement 65, leading radially to the outside.

Via pipe 33, wall 29 and plastic part 63 of the housing, the inner pipe 47, which extends as a separating wall through pipe 33, is electrically insulated from the metal parts of the housing 3, and is connected to an electric connection 67, to which is applied the electric signal for operating the target arrangement 1. Electrical contacting with the target arrangement takes place via the separating wall 53 which is peripherally connected to the metal holding frame 25, and potentially the foil 31a.

Water is preferably used as the cooling medium. From the connection 67 carrying high voltage for the target arrangement 1, the voltage drops along the section of the tube 61 extending radially to the outside, or the contained water column, due to the impedance of water, so that on the outside of the housing 3, the reference potential, e.g. ground potential, is practically reached. The cooling chamber in the axial direction is optimally thin so that overall an optimum effect of the magnet system on the surface of the target arrangement to be sputtered, is effected.

By providing the electrically insulating pipe, preferably comprising a synthetic material, and implemented integrally with wall 29, the insulation between the voltage-carrying inner pipe 47 as electrical feed to the target arrangement, as well as plate 53 to the metal parts of the housing 3, is ensured without complicated insulation measures, which further reduces the volume of the sputtering arrangement according to the invention. Providing the separating wall 53 in combination with the feed and return lines for the cooling medium in pipe 33 results optimally in a flow of fresh cooling medium along the target arrangement and its flow back in the region of wall 29 wherein the separating walls for the feed and return lines for the cooling medium are simultaneously used as electrical connection lines for the target arrangement 1.

In FIG. 3, and only shown on the right side, a mounting flange 70 is provided on the vacuum chamber. 72 is a vacuum ring seal, 74 is a HF seal, and 76 is a shield.

The target arrangement 1 is provided with a bayonet lock which can be tightened via foil 31a through the pressure of the cooling medium, and is removed or replaced by rotation with respect to the mounting or bayonet flange 25, at the vacuum chamber side. The entire arrangement with drive and cooling chamber including the foil 31a in FIG. 3, can be dismounted downwardly, thus from the normal atmosphere, and be removed from flange 70.

Through these constructive measures, which drastically simplify the arrangement, compactness is also achieved and the volume of the sputtering arrangement is reduced significantly.

By providing the flexible tube 61, and therewith realizing the use of water impedance, on the one hand, a sufficient voltage drop with low electric loss between high-voltage carrying parts and the housing 3 is ensured and, on the other hand, simultaneously the housing 3 is cooled. Consequently, with the same system to be provided for the target arrangement, cooling of the housing of the drive system and therewith its stator is effected by heat conduction.

Due to the large diameter of the annular gap coupling between stator and rotor, the rotation of the rotor can be driven optimally slowly and uniformly so that expensive and voluminous gearing is avoided. The rotational behavior of the drive system can be simply controlled or regulated electronically. Viewed overall, the number of required constructional parts is drastically reduced compared to conventional constructions of sputtering sources, which increases reliability and reduces constructional expenditures.

While a specific embodiment of the invention has been shown and described in detail to illustrate the application of the principles of the invention, it will be understood that the invention may be embodied otherwise without departing from such principles.

What is claimed is:

1. A magnetic field enhanced sputtering arrangement comprising:

an arrangement housing (3) having a front face;

a target arrangement (1) mounted to the front face of the arrangement housing;

a magnet carrier arrangement (5) rotatably supported about an axis with respect to the arrangement housing, and generating a flux ($\Phi_B$) which penetrates through a region of the mounted target arrangement (1), the region being shifted through a relative rotational motion between the carrier and target arrangements; and an electric motor drive (9, 10) with a drive housing non-rotatably connected to the arrangement housing (3), and with a rotor rotatably supported in the drive housing, which rotor, in turn, acts upon the magnet carrier arrangement (5); wherein the drive housing forms the arrangement housing (3) and the rotor (9) is non-rotatably connected to the magnet carrier arrangement (5).

2. A sputtering arrangement as stated in claim 1, including an electric motor transmission ($\Phi_M$) between the arrangement housing (3) and the rotor (9) which includes an annular air gap (12) coaxial with said axis, the air gap having a diameter which is substantially greater than the axial extent thereof.

3. A sputtering arrangement as stated in claim 1, implemented as a magnetron, which generates a tunnel-shaped magnetic field flux that exits and re-enters the mounted target arrangement.

4. A sputtering arrangement as stated in claims 1, wherein the region, during the rotational motion, travels on a closed path.

5. A sputtering arrangement as stated in claim 1, wherein the magnet carrier arrangement (5) comprises displaceable magnets (7).

6. A shuttering arrangement as stated in claim 5, wherein at least a portion of the magnets (7) are formed by electromagnets.

7. A sputtering arrangement as stated in claim 1, wherein the housing (3) is adapted for mounting on or in a vacuum coating apparatus.

8. A sputtering arrangement as stated in claim 1, wherein the rotor (9) comprises a circular disk.

9. A sputtering arrangement as stated in claim 8, wherein the arrangement housing comprises a cooling chamber portion (31) and a hollow axle (33) centrally penetrating the rotor, and a coolant feed/removal line (49), (51) provided at the front face of the arrangement housing (3) for conveying a cooling medium to and from the cooling chamber portion (31) and closed off from the target arrangement either, directly or indirectly via a heat-conducting foil (31a).

10. A sputtering arrangement as stated in claim 9, wherein the interior volume of the hollow axle (33), is divided via a separating wall (47), into said coolant feed line (49) and a coolant removal line (51) and the separating wall (47) forms an electrical feed for the target arrangement (1).

11. A sputtering arrangement as stated in claim 9, wherein the coolant feed/removal line in the hollow axle (33) is connected to a flexible cooling medium line looped around the arrangement housing (3).

12. A sputtering arrangement as stated in claim 8, wherein the arrangement housing comprises an axle (33) centrally penetrating the rotor, the axle comprising an electrical terminal connection (47) for the target arrangement (1).

13. A sputtering arrangement as stated in claim 8, wherein the arrangement housing comprises a hollow axle (33) centrally penetrating the rotor, in which axle a coolant feed (49) and removal line arrangement (51) is provided for conveying a cooling medium to and from a cooling chamber (31) in the arrangement housing, which is closed off from the target arrangement either directly, or indirectly via a heat-conducting foil.

14. A sputtering arrangement as stated in claim 13, wherein the cooling chamber is indirectly closed off by an electrically conducting and heat-conducting foil.

15. A sputtering arrangement as stated in claim 13, wherein the target arrangement (1) is:

a target plate or a target plate and a backing plate; and means defining a cooling chamber (31) and a line arrangement (33) implemented so as to be exchangeable for the purpose of replacing the target arrangement.

16. A sputtering arrangement as stated in claim 8, wherein the arrangement housing comprises a hollow axle (33) centrally penetrating the rotor, which axle forms a portion of a flow system (31, 49, 51) for a cooling medium for the target arrangement and an electrical connection line (47) in the axle, for the target arrangement, means in the arrangement housing defining a hollow volume containing a water impedance (61), electricity being carried via the water impedance (61) through the housing to the outside of the housing in such a way that the feed voltage for the target arrangement decreases along the water impedance.

17. A sputtering arrangement as stated in claim 8, wherein the arrangement housing (3) comprises a hollow axle (33) extending centrally through the rotor;

an electrical feed line (47) in the hollow axle (33) extending to the target arrangement (1);

the hollow axle being a portion of a cooling medium flow system (41, 49, 51) for cooling the target arrangement (1);

an outer wall of the hollow axle (33) being formed by an electrically insulating wall extending at the front face of the arrangement housing for closing off an arrangement housing chamber (35) containing the magnet carrier arrangement (5) and extending radially to the outside of the arrangement housing: and a line arrangement (61) extending through the arrangement housing (3) and communicating with the interior volume of the hollow axle for the cooling medium and which is implemented as an electrical water impedance along the housing (3).

18. A sputtering arrangement as stated in claim 1, including a arrangement housing chamber (35), the magnet carrier arrangement (5) being closed off at the front face thereof by a wall (29) which comprises an electrically insulating material.

19. A sputtering arrangement as stated in claim 1, wherein the electric motor drive is one of:

an asynchronous motor;
an electronically commutated motor; and a DC motor controlled electronically; and
wherein the extent of the axial air gap is substantially less than the diameter of the rotor.

20. A vacuum treatment apparatus including the sputtering arrangement of claim 1.

* * * * *